(12) United States Patent
Matsui et al.

(10) Patent No.: US 8,859,344 B2
(45) Date of Patent: Oct. 14, 2014

(54) SEMICONDUCTOR MEMORY

(75) Inventors: Yuichi Matsui, Kawasaki (JP); Nozomu Matsuzaki, Kokubunji (JP); Norikatsu Takaura, Tokyo (JP); Naoki Yamamoto, Kochi (JP); Hideyuki Matsuoka, Tokyo (JP); Tomio Iwasaki, Tsukuba (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 477 days.

(21) Appl. No.: 13/314,154

(22) Filed: Dec. 7, 2011

(65) Prior Publication Data

US 2012/0077325 A1    Mar. 29, 2012

Related U.S. Application Data

(63) Continuation of application No. 12/613,235, filed on Nov. 5, 2009, which is a continuation of application No. 11/596,220, filed as application No. PCT/JP2005/008419 on May 9, 2005, now abandoned.

(30) Foreign Application Priority Data

May 14, 2004    (JP) ................................. 2004-144704

(51) Int. Cl.
*H01L 21/82*    (2006.01)
*H01L 45/00*    (2006.01)
*H01L 27/24*    (2006.01)

(52) U.S. Cl.
CPC .............. *H01L 45/06* (2013.01); *H01L 45/144* (2013.01); *H01L 27/2436* (2013.01); *H01L 45/126* (2013.01); *H01L 45/12* (2013.01); *H01L 45/1675* (2013.01); *H01L 45/1233* (2013.01)

USPC ................. 438/131; 438/95; 438/130; 257/3; 257/E31.029; 257/E45.002

(58) Field of Classification Search
CPC ....................................................... H01L 45/04
USPC ......... 257/3, 246, E31.029, E45.002; 438/95, 438/128, 130, 131
See application file for complete search history.

(56) References Cited

U.S. PATENT DOCUMENTS 5,714,768 A    2/1998    Ovshinsky et al.
5,869,843 A    2/1999    Harshfield
(Continued)

FOREIGN PATENT DOCUMENTS

JP    H11-505071    5/1999
JP    2000-004001    1/2000
(Continued)

OTHER PUBLICATIONS

Office Action issued Feb. 5, 2013, in Japanese Patent Application No. 2006-513531.

(Continued)

*Primary Examiner* — David Vu
(74) *Attorney, Agent, or Firm* — Miles & Stockbridge P.C.

(57) ABSTRACT

Manufacturing processes for phase change memory have suffered from the problem of chalcogenide material being susceptible to delamination, since this material exhibits low adhesion to high melting point metals and silicon oxide films. Furthermore, chalcogenide material has low thermal stability and hence tends to sublime during the manufacturing process of phase change memory. According to the present invention, conductive or insulative adhesive layers are formed over and under the chalcogenide material layer to enhance its delamination strength. Further, a protective film made up of a nitride film is formed on the sidewalls of the chalcogenide material layer to prevent sublimation of the chalcogenide material layer.

20 Claims, 12 Drawing Sheets

(56) References Cited

U.S. PATENT DOCUMENTS

| | | |
|---|---|---|
| 5,933,365 A | 8/1999 | Klersy et al. |
| 6,518,671 B1 | 2/2003 | Yang et al. |
| 6,744,088 B1 | 6/2004 | Dennison |
| 6,756,262 B1 | 6/2004 | Nakamura et al. |
| 7,037,749 B2 * | 5/2006 | Horii et al. .............. 438/95 |
| 7,105,396 B2 * | 9/2006 | Hwang et al. ............ 438/198 |
| 7,411,208 B2 | 8/2008 | Hwang et al. |
| 2001/0023119 A1 | 9/2001 | Reinberg |
| 2002/0017701 A1 | 2/2002 | Klersy et al. |
| 2002/0075631 A1 | 6/2002 | Singh et al. |
| 2002/0080647 A1 | 6/2002 | Chiang et al. |
| 2003/0001242 A1 | 1/2003 | Lowrey et al. |
| 2003/0067013 A1 | 4/2003 | Ichihara et al. |
| 2003/0096497 A1 | 5/2003 | Moore et al. |
| 2003/0146469 A1 | 8/2003 | Matsuoka et al. |
| 2003/0209746 A1 | 11/2003 | Horii |
| 2003/0219924 A1 | 11/2003 | Bez et al. |
| 2004/0026730 A1 | 2/2004 | Kostylev et al. |
| 2004/0037179 A1 | 2/2004 | Lee |
| 2004/0233748 A1 | 11/2004 | Terao et al. |
| 2005/0024933 A1 * | 2/2005 | Pellizzer et al. ............ 365/163 |
| 2010/0044672 A1 | 2/2010 | Matsui et al. |
| 2012/0074377 A1 | 3/2012 | Matsui et al. |
| 2012/0241715 A1 | 9/2012 | Matsui et al. |

FOREIGN PATENT DOCUMENTS

| | | |
|---|---|---|
| JP | 2001-144266 | 5/2001 |
| JP | 2002-057296 | 2/2002 |
| JP | 2002-184861 | 6/2002 |
| JP | 2003-174144 | 6/2003 |
| JP | 2003-229537 | 8/2003 |
| JP | 2004-096014 | 3/2004 |

OTHER PUBLICATIONS

Office Action issued Jul. 30, 2013, in Japanese Patent Application No. 2011-218893.
U.S. Appl. No. 12/613,235, filed Nov. 5, 2009.
U.S. Appl. No. 13/314,165, filed Dec. 7, 2011.
U.S. Appl. No. 13/493,442, filed Jun. 11, 2012.
Office Action Sep. 7, 2011 issued in Taiwanese Application No. 094115624.
Office Action issued Aug. 13, 2014, in Taiwanese Patent Application No. 100145624.

* cited by examiner

Continuous or discontinuous film

US 8,859,344 B2

SEMICONDUCTOR MEMORY

CROSS-REFERENCE TO RELATED APPLICATIONS

This application is a continuation of U.S. application Ser. No. 12/613,235 filed Nov. 5, 2009, which is a continuation of U.S. application Ser. No. 11/596,220 filed Nov. 14, 2006, now abandoned which is a 371 of International Application No. PCT/JP2005/008419 filed May 9, 2005.

TECHNICAL FIELD

The present invention relates to a technique that is effective when applied to semiconductor integrated circuit devices which employ phase change memory cells formed of a phase change material such as chalcogenide.

BACKGROUND ART

Mobile devices, typified by cellular phones, use a semiconductor memory such as a DRAM, SRAM, or flash memory. A DRAM provides large capacity but its access speed is low. A SRAM, on the other hand, is high-speed memory, but is not suitable for forming a large capacity memory, since each cell requires a number of transistors (4 to 6 transistors) and hence it is difficult to produce highly integrated SRAM. DRAM and SRAM must continuously receive power to retain data; that is, they are volatile memories. Flash memory, on the other hand, is a nonvolatile memory; it does not need to continuously receive power to electrically retain data. However, the flash memory is disadvantageous in that its program/erase count is limited to a maximum of approximately $10^5$ and its reprogramming speed is a few orders of magnitude lower than those of other memories. Since each memory (described above) has its disadvantage, it is current practice to select suitable memory depending on the application.

If a universal memory having all the advantages of DRAM, SRAM, and flash memory were developed, a plurality of memories could be integrated on a single chip, which allows cellular phones and other mobile devices to be miniaturized and enhanced in functionality. If the universal memory could replace all other types of memory, it would have a tremendous impact (on the semiconductor industry). The requirements for universal memory are that: (1) like DRAM, it is highly integrated (and hence can have large capacity); (2) its access (write/read) speed is high, comparable to that of SRAM; (3) it has the same nonvolatility as flash memory; and (4) it exhibits low power consumption and hence can be powered by a small battery.

Among next-generation nonvolatile memories referred to as universal memories, phase change memory is currently attracting the most attention. Phase change memory uses a chalcogenide material, which is also used by CD-RWs and DVDs. Like these disks, phase change memory stores data by assuming two states: a crystalline state and an amorphous state. However, they differ in how data is written to or read from them. Specifically, whereas a laser is used to write to or read from CD-RWs and DVDs, the Joule heat generated by an electrical current is used to write data to the phase change memory and the change in the resistance of the memory due to the phase change is read as a data value.

The principle of operation of phase change memory will be described with reference to FIG. 2. When a chalcogenide material is amorphized, such a reset pulse is applied that causes the chalcogenide material to be rapidly quenched after it is heated to a melting point or more. The melting point is, for example, 600° C., and the quench time (t1) is, for example, 2 nsec. When crystallizing the chalcogenide material, on the other hand, a set pulse is applied to the memory so as to maintain the chalcogenide material at a temperature between its crystallization point and melting point. The crystallization point is, for example, 400° C., and the time (t2) required for the crystallization is, for example, 50 nsec. A feature of phase change memory is that the resistance value of the chalcogenide material (of the phase change memory) varies by two to three orders of magnitude depending on its crystallization state. Since (the change in) the resistance value is used as a signal, the read signal is large, facilitating the sense operation and hence increasing the speed of the read operation. Another feature of the phase change memory is that it can be reprogrammed $10^{12}$ times, which is an advantage over flash memory. Still another feature of the phase change memory is that it can operate at a low voltage and low power, which allows it to be formed on the same chip as logic circuitry. Therefore, phase change memory is suitable for use in mobile devices.

An exemplary manufacturing process for a phase change memory cell will now be briefly described with reference to FIGS. 3 to 5. First, a select transistor is formed on a semiconductor substrate by a known manufacturing method (not shown). The select transistor is made up of a MOS transistor or bipolar transistor. Then, an interlayer insulating film 1 made up of a silicon oxide film is deposited and a plug 2 of, for example, tungsten is formed in the interlayer insulating film 1 by a known manufacturing method. This plug is used to electrically connect between the select transistor and the phase change material layer overlying the select transistor. Then, a chalcogenide material layer 3 of, for example, GeSbTe, an upper electrode 4 of, for example, tungsten, and a hard mask 5 made up of, for example, a silicon oxide film are sequentially deposited, forming the structure shown in FIG. 3.

Then, the hard mask 5, the upper electrode 4, and the chalcogenide material layer 3 are processed by a known lithographic technique and dry etching technique, as shown in FIG. 4.

After that, an interlayer insulating film 6 is deposited, as shown in FIG. 5.

Then, a wiring layer electrically connected to the upper electrode 4 is formed on the interlayer insulating film 6, and a plurality of other wiring layers are formed on the wiring layer on the interlayer insulating film 6, completing formation of phase change memory (not shown).

Patent Document 1: Japanese Laid-Open Patent Publication No. 2003-174144
Patent Document 2: Japanese Laid-Open Patent Publication No. 2003-229537

DISCLOSURE OF THE INVENTION

Problems to be Solved by the Invention

There are two problems that make it difficult to manufacture phase change memory: the low adhesive strength and the low thermal stability of the chalcogenide material. How the manufacturing process is affected by each problem will be specifically described.

First, since chalcogenide material has low adhesive strength, it tends to delaminate (or peel) during the manufacturing process. Since the chalcogenide material is heated to its melting point or a higher temperature when the phase change memory is in operation (as described above), the plug and the upper electrode in contact with the chalcogenide material must be formed of a high melting point metal. For example, tungsten a high melting point metal conventionally used in semiconductor integrated circuit devices. However, we have found that since chalcogenide material (layer) has low adhesion to high melting point metals such as tungsten, it tends to delaminate at its interfaces with the plug and the upper electrode. Furthermore, since the chalcogenide material also exhibits low adhesion to silicon oxide films, it also tends to delaminate at its interface with the interlayer insulating film.

It is obvious that the manufacturing process described with reference to FIGS. 3 to 5 produces a phase change memory cell in which the chalcogenide material exhibits low adhesion at its upper and lower interfaces. Therefore, there is a need for a means of enhancing the adhesive strength of the chalcogenide material (at these interfaces).

Second, since the thermal stability of chalcogenide material is low, it tends to sublime during the manufacturing process. FIGS. 6A to 6C show results of thermal desorption spectrometry of a GeSbTe film. This analysis was conducted in ultrahigh vacuum (approximately, $10^{-7}$ Pa). When the GeSbTe film was heated to approximately 300° C., the elements Ge, Sb, and Te sublimed at the same time, as shown in the figures. The sample was further heated to 500° C. and then cooled to room temperature. After this, we retrieved the sample and found that the GeSbTe film had completely disappeared. Thus, chalcogenide material has very low thermal stability. The low thermal stability of the chalcogenide material does not cause problems with CD-RW and DVD manufacturing processes, since these processes do not include any high-temperature heating process. (That is why CD-RWs and DVDs employ a substrate of polycarbonate, which has low heat resistance.) However, care must be taken when using a chalcogenide material in a semiconductor integrated circuit device whose manufacture includes a wiring process in which the wafer is heated to 400° C. or higher. FIG. 7 is a graph showing the sublimation characteristics of a GeSbTe film, wherein the horizontal axis represents temperature and the vertical axis represents pressure. Specifically, the temperature and pressure at which the GeSbTe film was heat-treated were varied. In the figure, each open circle indicates a condition in which the GeSbTe film did not sublime, while each solid circle indicates a condition in which the GeSbTe film sublimed. As show in the figure, the lower the pressure under which the GeSbTe film was heat-treated, the lower the temperature at which it sublimed. A manufacturing process of a semiconductor integrated circuit device performs, for example, chemical vapor phase growth at a pressure of approximately $10^{-1}$-$10^3$ Pa and a temperature of approximately 400-700° C.

As can be seen from FIG. 7, the GeSbTe film will sublime if it is directly exposed to these conditions.

In the manufacturing process described with reference to FIGS. 3 to 5, the interlayer insulating film 6 must be formed by chemical vapor phase growth, which is superior in terms of step coverage. As a result, the chalcogenide material layer 3 might sublime at its sidewalls. Therefore, there is a need for a means for maintaining the thermal stability of chalcogenide material even if a portion of the material is exposed.

Means for Solving the Problems

The above objects may be achieved by a semiconductor memory device comprising: a semiconductor substrate; a select transistor formed on a principal surface of the semiconductor substrate; an interlayer insulating film provided on the select transistor; a plug provided so as to penetrate through the interlayer insulating film, and electrically connected to the select transistor; a phase change material layer provided so as to extend over the interlayer insulating film, and connected with the plug; an upper electrode provided on the phase change material layer; and an adhesive layer provided between an under surface of the phase change material layer and top surfaces of the interlayer insulating film and the plug.

Further, the above objects may also be achieved by a semiconductor memory device comprising: a semiconductor substrate; a select transistor formed on a principal surface of the semiconductor substrate; an interlayer insulating film provided on the select transistor; a plug provided so as to penetrate through the interlayer insulating film, the plug being electrically connected to the select transistor; a phase change material layer provided on the interlayer insulating film such that a portion of the phase change material layer is connected with the plug; an upper electrode provided on the phase change material layer; and a protective film formed on at least a sidewall of the phase change material layer and containing a silicon nitride.

Effects of the Invention

The major effects of the present invention will now be briefly described.

The adhesive layers formed over and under the chalcogenide material layer can prevent delamination of the chalcogenide material layer during the manufacturing process. Further, the protective film formed on the sidewalls of the chalcogenide material layer can prevent sublimation of the chalcogenide material layer during the manufacturing process.

These arrangements improve the phase change memory manufacturing process in such a way as to reduce variations in the electrical characteristics of the phase change memory, as well as preventing reliability degradation.

BEST MODES FOR CARRYING OUT THE INVENTION

A first means of the present invention is to form adhesive layers over and under the chalcogenide material (layer) so as to enhance the adhesive strength of the chalcogenide material (at its interfaces with the overlying and underlying layers). First, the effects of these adhesive layers will be described. We formed GeSbTe films on $SiO_2$ films to a thickness of 100 nm, and performed a scratch test on these GeSbTe films to compare their delamination strength. In a scratch test, a thin film surface of a sample is scratched by an indenter while applying a load to the sample in the vertical direction, in order to determine the minimum load that cause delamination (referred to as the "critical delamination load"). The higher the critical delamination load, the higher the delamination strength. FIG. 8 shows the (critical delamination load) measurement results. As shown in FIG. 8, the delamination strength of the GeSbTe film was extremely low when an adhesive layer was not inserted (between the GeSbTe film and the $SiO_2$ film). Further, insertion of a W layer did not lead to any improvement in the delamination strength of the GeSbTe film. This reflects the fact that chalcogenide material has low adhesion to high melting point metals. On the other hand, inserting an Al material layer increased the delamination strength of the GeSbTe film by a factor of 7-9, and inserting a Ti material layer enhanced the delamination strength by a factor of 10-15.

These results indicate that insertion of an adhesive layer may be effective in enhancing the adhesive properties of the chalcogenide material. As can be seen from FIG. 8, Ti material is superior to Al material as an adhesive layer. Further, nitrides have higher adhesion to chalcogenide material than oxides, and individual metals have higher adhesion than oxides and nitrides.

An exemplary manufacturing process of the present invention will be described with reference to FIG. 1. First, an interlayer insulating film 1 and a plug 2 are formed by a conventional technique. Then, the following layers are sequentially deposited: an adhesive layer 7 of, for example, titanium; a chalcogenide material layer 3 of, for example, GeSbTe; an adhesive layer 8 of, for example, titanium; an upper electrode 4 of, for example, tungsten; and a hard mask 5 made up of, for example, a silicon oxide film. Then, the hard mask 5, the upper electrode 4, the adhesive layer 8, the chalcogenide material layer 3, and the adhesive layer 7 are processed by a known lithographic technique and dry etching technique, forming the structure shown in FIG. 1.

Thus, in the above manufacturing process, adhesive layers are formed over and under the chalcogenide material layer, which increases the delamination strength of the chalcogenide material layer and thereby prevents its delamination during the manufacturing process.

It should be noted that although in the above example two adhesive layers are formed over and under, respectively, the chalcogenide layer, the present invention is not limited to this particular arrangement. An adhesive layer may be formed only either over or under the chalcogenide layer.

The desired thickness of the adhesive layers will now be described. FIGS. 9A and 9B show the temperature vs. resistance characteristics of GeSbTe films. Specifically, FIG. 9A shows the temperature vs. resistance characteristics of a GeSbTe film with no adhesive layer. When the GeSbTe film set in an amorphous state was heated, it crystallized at approximately 120-130° C. and, as a result, its resistance rapidly decreased. Then, the film was cooled after being heated to approximately 200° C. (as shown in FIG. 9A). The resistance of the GeSbTe film changed by five or more orders of magnitude (between the amorphous and crystalline states). Since phase change memory uses the resistance value of the chalcogenide material layer as a signal, the larger the change in the resistance of the chalcogenide material between amorphous and crystalline states, the better. On the other hand, FIG. 9B shows the temperature vs. resistance characteristics of a GeSbTe film with a 2.5 nm thick adhesive layer of titanium. In this case, the GeSbTe film had low resistance even when it was in an amorphous state. The GeSbTe film was heated to approximately 200° C., so that the film crystallized. Then, the GeSbTe film was cooled. The resistance did not change much (between the amorphous and crystalline states). The reason for this may be that titanium within the adhesive layer diffused into the GeSbTe film. This indicates that if the adhesive layer has a small thickness, it may degrade the characteristics of the phase change memory.

The thickness of the adhesive layers in phase change memory is preferably 5 nm or less although this may vary depending on the material of these layers. Further, the thickness of the adhesive layers is more preferably 2 nm or less to increase the ratio between the resistance values in amorphous and crystalline states.

The desired materials for the adhesive layers will now be described. A current (as a set pulse or reset pulse) is supplied from the select transistor to the chalcogenide material (layer) through the plug to change the phase of the chalcogenide material. To efficiently deliver this current to the chalcogenide material, the adhesive layer at the interface between the chalcogenide material layer and the plug is preferably electrically conductive. Likewise, the adhesive layer at the interface between the chalcogenide material layer and the upper electrode is also preferably conductive.

Further, the smaller the regions used to change the phase of the chalcogenide material, the smaller the current required for reprogramming (the memory cell). That is, to reduce the power consumption of the phase change memory cell, all regions other than the plug need be insulative (or nonconductive), and the adhesive layer at the interface between the chalcogenide material layer and the interlayer insulating film is preferably insulative.

FIG. 10 shows a phase change memory cell using an ideal material for the adhesive layers. Referring to the figure, a conductive adhesive layer 9 is formed at the interface between a chalcogenide material layer 3 and a plug 2; an insulative adhesive layer 10 is formed at the interface between the chalcogenide material layer 3 and an interlayer insulating film 1; and a conductive adhesive layer 11 is formed between the chalcogenide material layer 3 and an upper electrode 4.

Examples of conductive adhesive layers include Ti, Al, Ta, Si, Ti nitride, Al nitride, Ta nitride, W nitride, TiSi, TaSi, WSi, TiW, TiAl nitride, TaSi nitride, TiSi nitride, and WSi nitride films. Further, since Te in chalcogenide material is reactive with Ti and Al, a layer formed of a compound of Ti and Te, or Al and Te, may be used as a conductive adhesive layer. Examples of insulative adhesive layers include Ti oxide, Al oxide, Ta oxide, Nb oxide, V oxide, Cr oxide, W oxide, Zr oxide, Hf oxide, and Si nitride films.

Further, the adhesive layer at the interface between the chalcogenide material layer and the interlayer insulating film need not necessarily be insulative (or nonconductive) if the chalcogenide material layer is not (fully) electrically connected to the interlayer insulating film. (This also reduces the regions used to cause a change in the phase of the chalcogenide material.) For example, the adhesive layer may be a conductive layer having an island shape (i.e., a discontinuous conductive layer). In this case, the adhesive layer at the interface between the chalcogenide material layer and the plug and the adhesive layer at the interface between the chalcogenide material layer and the interlayer insulating film can be formed of the same material at the same time. When an adhesive layer is formed to an island shape (or when a discontinuous adhesive layer is formed), its thickness is preferably 2 nm or less. Further, the thickness of the adhesive layer is more preferably 1 nm or less to increase or ensure the electrical discontinuity (between the chalcogenide material layer and the interlayer insulating film). For example, the adhesive layers may be formed of titanium to a thickness of 0.5 nm.

It should be noted that Patent Document 1 (listed above), for example, discloses means for using an adhesive layer to improve the adhesion between a chalcogenide material and a dielectric material. The present invention is different from this technique. As described above, in a phase change memory cell, the plug and the upper electrode must be formed of a high melting point metal such as tungsten. However, we have found that the chalcogenide material tends to delaminate at its interfaces with such a plug and upper electrode. The present invention has been devised to solve this problem. On the other hand, the above known technique (disclosed in Patent Document 1) is intended to insert an adhesive layer only between a chalcogenide material and an interlayer insulating film (formed of a dielectric material), which is distinctly different from the technique of the present invention.

A second means of the present invention is to form a protective film on the sidewalls of the chalcogenide material layer to ensure the thermal stability of the chalcogenide material.

An exemplary manufacturing process of the present invention will be described with reference to FIG. 11. First, an interlayer insulating film 1 and a plug 2 are formed by a conventional technique. Then, a chalcogenide material layer 3 of, for example, GeSbTe, an upper electrode 4 of, for example, tungsten, and a hard mask 5 made up of, for example, a silicon oxide film are sequentially deposited. After that, the hard mask 5, the upper electrode 4, and the chalcogenide material layer 3 are processed by a known lithographic technique and dry etching technique. Then, a sidewall protective film 12 made up of, for example, a silicon nitride film is deposited, and an interlayer insulating film 6 is further deposited, as shown in FIG. 11.

Thus, the sidewalls of the chalcogenide material layer that have been processed by dry etching are fully covered with the protective film, preventing sublimation of the chalcogenide material during the interlayer insulating film forming process.

The desired conditions for forming the sidewall protective film will now be described. Chalcogenide material sublimes when exposed to high temperature, low pressure conditions, as described with reference to FIG. 7. Therefore, the sidewall protective film must be formed under low temperature, high pressure conditions, which correspond to the upper left portion of FIG. 7. Especially, reducing the process temperature is effective in preventing sublimation of the chalcogenide material. Exemplary conditions are such that the pressure is 0.1 Pa or more and the temperature is 450° C. or less, although this may vary depending on the chalcogenide material.

The desired material for the sidewall protective film will now be described. The sidewall protective film is formed by plasma CVD, etc., since it must be formed at low temperature. If a silicon oxide film is used as the sidewall protective film, the sidewalls of the chalcogenide material (layer) are exposed to oxygen activated by the plasma. In this case, since chalcogenide material is easily oxidized, a portion of the chalcogenide material (layer) might be oxidized, resulting in degraded characteristics. Therefore, a silicon nitride film is preferably used as the sidewall protective film, since it is "inactive against chalcogenide material" (or does not cause an oxidation problem such as that described above) and can be formed by CVD, which is a superior technique in terms of step coverage.

It should be noted that Patent Document 2 (listed above), for example, discloses means for forming a protective film on the sidewalls of a chalcogenide material (layer) to prevent its sublimation. However, this technique is different from the present invention in that an oxide film is used as the protective film.

Preferred embodiments of the present invention will be described in detail with reference to the accompanying drawings. It should be noted that in all figures, like numerals are used to denote components having like functions to avoid undue repetition.

First Embodiment

A first embodiment of the present invention will be described with reference to FIG. 12. This embodiment provides an example in which conductive adhesive layers are formed both over and under the chalcogenide material layer.

First of all, a semiconductor substrate 101 is provided, and a MOS transistor is formed on the substrate as a select transistor. Specifically, trench isolation (or device separation) oxide films 102 for isolating the MOS transistor are formed in the surface of the semiconductor substrate 101 by a known selective oxidation technique or shallow trench isolation technique. The present embodiment uses the shallow trench isolation technique, which also can planarize the surface. First, isolation trenches are formed in the substrate by a known dry etching technique. Then, after removing damage left on the sidewalls and bottoms of the trenches in the previous dry etching process, an oxide film is deposited by a known CVD technique. Then, portions of the oxide film other than those in the trenches are polished (and thereby removed) by a known CMP technique, leaving the trench isolation oxide films 102 within the trenches.

Then, though not shown in the figure, wells of two different conductive types are formed by high-energy impurity implantation.

Then, after cleaning the surface of the semiconductor substrate, a gate oxide film 103 (for the MOS transistor) is grown by a known thermal oxidation technique. Then, a gate electrode 104 of polysilicon and a silicon nitride film 105 are (sequentially) deposited on the surface of the gate oxide film 103. After that, the gate is processed by a lithographic process and a dry etching process, and then impurities are implanted using the gate electrode and a resist as masks to form diffusion layers 106. It should be noted that although according to the present embodiment the gate electrode is made of polysilicon, it may be a polymetal gate (low resistance gate) having a laminated structure (metal/barrier metal/polysilicon).

Then, a silicon nitride film 107 is deposited by CVD. (This film is used to help form self-aligned contacts.)

Then, an interlayer insulating film 108 made up of a silicon oxide film is deposited on the entire surface, and its surface roughness due to the gate electrode is removed by a known CMP technique, planarizing the surface. After that, plug contact holes are formed by a lithographic process and a dry etching process. At that time, to prevent exposure of the gate electrode, the interlayer insulating film 108 is processed under the so-called self-alignment conditions, that is, the interlayer insulating film 108 (i.e., a silicon oxide film) is selectively etched against the silicon nitride film 107 with a high selectivity ratio.

It should be noted that the following process may be used to ensure that the plug contact holes are fully connected with the diffusion layers 106 without causing a problem to other layers: first, the interlayer insulating film (or silicon oxide film) 108 is selectively dry etched against the silicon nitride film with a high selectivity ratio so as to leave the portions of the silicon nitride film on the top surfaces of the diffusion layers 106; and then the silicon nitride film is selectively dry etched against the silicon oxide film with a high selectivity ratio to remove the portions of the silicon nitride film left on the top surfaces of the diffusion layers 106.

Then, tungsten layers (or tungsten) are formed buried in the plug contact holes, and tungsten plugs 109 are formed by a known CMP technique (that is, the tungsten layers are processed into tungsten plugs 109 by a known CMP technique).

Then, a tungsten layer is newly deposited to a thickness of 100 nm by sputtering and processed by a lithographic process and a dry etching process to form first wiring layers 110A and 110B. After that, an interlayer insulating film 111 made up of a silicon oxide film is deposited on the entire surface, and its surface roughness due to the first wiring layers is removed by a known CMP technique, planarizing the surface. Then, a plug contact hole is formed by a lithographic process and a dry etching process and filled with a tungsten layer. Then, a tungsten plug 112 is formed by a known CMP technique.

Then, the following layers are sequentially deposited by a known sputtering technique: a conductive adhesive layer 113 of titanium having a thickness of 1 nm, a chalcogenide material layer 114 of GeSbTe having a thickness of 100 nm, a conductive adhesive layer 115 of titanium having a thickness of 1 nm, and an upper electrode 116 of tungsten having a thickness of 50 nm. After that, a silicon oxide film 117 is deposited by a known CVD technique. Then, the silicon oxide film 117, the upper electrode 116, the conductive adhesive layer 115, the chalcogenide material layer 114, and the conductive adhesive layer 113 are sequentially processed by a known, lithographic process and dry etching process.

It should be noted that the chalcogenide material may be crystallized by heat treatment after depositing the upper electrode 116 or the silicon oxide film 117. This heat treatment process can be performed under any conditions that allow the chalcogenide material to crystallize. Exemplary conditions are such that: the treatment atmosphere is an argon gas or nitrogen gas atmosphere; the treatment temperature is 200-600° C.; and the treatment time is 1-10 minutes.

Then, an interlayer insulating film 118 made up of a silicon oxide film is deposited on the entire surface, and its surface roughness is removed by a known CMP technique, planarizing the surface. After that, a plug contact hole is formed by a lithographic process and a dry etching process. Then, a tungsten layer is buried in the plug contact hole, and a tungsten plug 119 is formed by a known CMP technique. Then, an aluminum layer is deposited to a thickness of 200 nm and processed to form a second wiring layer 120. It should be noted that copper, which has lower resistance than aluminum, may be used instead of aluminum.

This substantially completes manufacture of the phase change memory cell of the present embodiment.

According to the present embodiment, adhesive layers are formed over and under the chalcogenide material layer, which increases the delamination strength of the chalcogenide material layer and thereby prevents its delamination during the manufacturing process.

Although the above example uses Ti films as the adhesive layers, the present embodiment is not limited to this particular material. The adhesive layers may be conductive films such as Al, Ta, Si, Ti nitride, Al nitride, Ta nitride, W nitride, TiSi, TaSi, WSi, TiW, TiAl nitride, TaSi nitride, TiSi nitride, or WSi nitride films. Further, the adhesive layers may be formed of a compound of Ti and Te or a compound of Al and Te.

It should be noted that the present invention is not limited to the preferred embodiments described above. It is obvious that the present invention embraces all means described in the "Best Modes for Carrying out the Invention" section of this specification.

Second Embodiment

A second embodiment of the present invention will be described with reference to FIG. 13. This embodiment provides an example in which: a conductive adhesive layer is formed at the interface between the chalcogenide material layer and the plug; an insulative adhesive layer is formed at the interface between the chalcogenide material layer and the interlayer insulating film; and a conductive adhesive layer is formed at the interface between the chalcogenide material layer and the upper electrode.

Since the steps before and including the step of forming the tungsten plug 112 are the same as those described in connection with the first embodiment, a description of these steps is not provided herein.

There will now be described a process of forming an insulative adhesive layer 121 and a conductive adhesive layer 122 on the interlayer insulating film 111 and on the tungsten plus 112, respectively, in a self-aligned manner. First, a titanium layer is deposited on the entire surfaces of the interlayer insulating film 111 and the tungsten plug 112 to a thickness of 3 nm by sputtering and then heat treated. Since titanium has a lower free energy of oxide formation than silicon, the portion of the titanium layer deposited on the interlayer insulating film 111 (that is, a silicon oxide film) reacts with oxygen in the underlying interlayer insulating film 111 to form a titanium oxide film. The portion of the titanium layer deposited on the tungsten plug 112, on the other hand, reacts with tungsten in the underlying tungsten plug 112 to form a conductive titanium-tungsten alloy. Thus, the insulative adhesive layer 121 is formed on the interlayer insulating film 111 and the conductive adhesive layer 122 is formed on the tungsten plug 112 in a self-aligned manner.

The above heat treatment can be performed at any temperature that causes titanium to react with the silicon oxide film. However, 400° C. or a higher temperature is preferred to form a favorable titanium oxide film. Further, the heat treatment is preferably performed in an inert atmosphere to prevent oxidation of the conductive adhesive layer. Exemplary conditions are such that: the treatment atmosphere is an argon gas atmosphere; the treatment temperature is 400-800° C.; and the treatment time is 1-10 minutes.

Then, a chalcogenide material layer 114 of GeSbTe having a thickness of 100 nm, a conductive adhesive layer 115 of titanium having a thickness of 1 nm, and an upper electrode 116 of tungsten having a thickness 50 nm are sequentially deposited by a known sputtering technique. After that, a silicon oxide film 117 is deposited by a known CVD technique. Then, the silicon oxide film 117, the upper electrode 116, the conductive adhesive layer 115, the chalcogenide material layer 114, and the insulative adhesive layer 121 are sequentially processed by a known lithographic process and dry etching process.

It should be noted that the chalcogenide material may be crystallized by heat treatment after depositing the upper electrode 116 or the silicon oxide film 117. This heat treatment process can be performed under any conditions that allow the chalcogenide material to crystallize. Exemplary conditions are such that: the treatment atmosphere is an argon gas or nitrogen gas atmosphere; the treatment temperature is 200-600° C.; and the treatment time is 1-10 minutes.

Since the steps following the above step are the same as those described in connection with the first embodiment, a description thereof is not provided herein.

These steps substantially complete manufacture of the phase change memory cell of the present embodiment.

According to the present embodiment, adhesive layers are formed over and under the chalcogenide material layer, which increases the delamination strength of the chalcogenide material layer and thereby prevents its delamination during the manufacturing process. Further, since a conductive adhesive layer is formed at the interface between the chalcogenide material layer and the plug, a current can be efficiently delivered to the chalcogenide material. Still further, since an insulative (or nonconductive) adhesive layer is formed at the interface between the chalcogenide material layer and the interlayer insulating film, the current required to reprogram the chalcogenide material (or the memory cell) can be reduced.

Although in the above example the adhesive layers formed on the interlayer insulating film and the plug are formed of Ti, the present embodiment is not limited to this particular material. Any metal having a lower free energy of oxide formation than Si, such as Zr, Hf, or Al, can be used, with the same effect.

It should be noted that the present invention is not limited to the preferred embodiments described above. It is obvious that the present invention embraces all means described in the "Best Modes for Carrying out the Invention" section of this specification.

Third Embodiment

A third embodiment of the present invention will be described with reference to FIG. 14. This embodiment provides an example in which a protective film is formed on the sidewalls of the chalcogenide material layer. Since the steps before and including the step of forming the tungsten plug 112 are the same as those described in connection with the first embodiment, a description of these steps is not provided herein.

First, a chalcogenide material layer 114 of GeSbTe having a thickness of 100 nm and an upper electrode 116 of tungsten having a thickness of 50 nm are sequentially deposited over the entire surfaces of the interlayer insulating film 111 and the tungsten plug 112 by a known sputtering technique. After that, a silicon oxide film 117 is deposited by a known CVD technique. Then, the silicon oxide film 117, the upper electrode 116, and the chalcogenide material layer 114 are sequentially processed by a known lithographic process and dry etching process. It should be noted that the chalcogenide material may be crystallized by heat treatment after depositing the upper electrode 116 or the silicon oxide film 117. This heat treatment process can be performed under any conditions that allow the chalcogenide material to crystallize. Exemplary conditions are such that: the treatment atmosphere is an argon gas or nitrogen gas atmosphere; the treatment temperature is 200-600° C.; and the treatment time is 1-10 minutes.

Then, a sidewall protective film 123 made up of a silicon nitride film is deposited to a thickness of 20 nm by a known CVD technique. It should be noted that this sidewall protective film must be formed under high temperature, low pressure conditions to prevent sublimation of the chalcogenide material. Exemplary conditions are such that the pressure is 0.1 Pa or more and the temperature is 450° C. or less.

Then, an interlayer insulating film 118 made up of a silicon oxide film is deposited on the entire surface, and its surface roughness is removed by a known CMP technique, planarizing the surface. After that, a plug contact hole is formed by a lithographic process and a dry etching process. Then, a tungsten layer is formed buried in the plug contact hole, and a tungsten plug 119 is formed by a known CMP technique. Then, an aluminum layer is deposited to a thickness of 200 nm and processed to form a second wiring layer 120. (It should be noted that copper, which has lower resistance than aluminum, may be used instead of aluminum.)

This substantially completes manufacture of the phase change memory cell of the present embodiment. According to the present embodiment, the sidewalls of the chalcogenide material layer that have been processed by dry etching are fully covered with a protective film, preventing sublimation of the chalcogenide material during the interlayer insulating film forming process.

The above example uses a silicon nitride film as the sidewall protective film. The reason for this is that if a silicon oxide film is used as the sidewall protective film, the sidewalls of the chalcogenide material (layer) might be oxidized, resulting in degraded characteristics. In addition, the silicon nitride film helps process regions other than the chalcogenide material layer 114 region in a self-aligned manner.

Such a process will be described with reference to FIG. 15. FIG. 15 shows a structure to the left of the structure shown in FIG. 12, 13, or 14. Referring to FIG. 15, a first wiring layer 110B is electrically connected to the source or drain of the MOS transistor (shown in FIGS. 12 to 14).

Since the steps before and including the step of depositing the silicon nitride film 123 to a thickness of 20 nm by a known CVD technique are the same as those described in connection with the third embodiment, a description of these steps is not provided herein. Note that the silicon nitride film 123 shown in FIG. 15 corresponds to the sidewall protective film 123 (for the chalcogenide material layer) shown in FIG. 14. Then, an interlayer insulating film 118 made up of a silicon oxide film is deposited on the entire surface, and its surface roughness is removed by a known CMP technique, planarizing the surface. After that, a plug contact hole reaching the surface of the silicon nitride film 123 is formed by a lithographic process and a dry etching process. This dry etching process is performed under such conditions that the etching rate of the silicon oxide film is higher than that of the silicon nitride film. Then, dry etching is further performed under such conditions that the etching rate of the silicon nitride film is higher than that of the silicon oxide film to extend the plug contact hole to the surfaces of the tungsten plug 112 and the interlayer insulating film 111.

In the above process, even if the plug contact hole is misaligned with the tungsten plug 112, the interlayer insulating film 111 is not deeply etched.

Then, a tungsten layer is formed buried in the plug contact hole, and a tungsten plug 119 is formed by a known CMP technique. After that, an aluminum layer is deposited to a thickness of 200 nm and processed to form a second wiring layer 120. It should be noted that copper, which has lower resistance than aluminum, may be used instead of aluminum. Thus, this process allows the tungsten plug 119 to be formed on the tungsten plug 112 in a self-aligned manner. Therefore, a silicon nitride film is preferably used as the sidewall protective film for the chalcogenide material layer.

It should be noted that the present invention is not limited to the preferred embodiments described above. It is obvious that the present invention embraces all means described in the "Best Modes for Carrying out the Invention" section of this specification.

Although the present invention has been specifically described based on preferred embodiments thereof, it should be understood that the invention is not limited to these embodiments and various alterations may be made thereto without departing from the scope and spirit of the invention.

As described above, the first and second embodiments provide exemplary adhesive layers and the third embodiment provides an exemplary sidewall protective film, separately. However, these embodiments may be combined as necessary to collectively utilize their effects.

There will now be described technical ideas of the present invention other than those indicated by the appended claims. (These technical ideas can be understood from the above description of the preferred embodiments.)

1) A method for manufacturing a semiconductor integrated circuit device, comprising the steps of:
   forming a select transistor in a memory cell region on a semiconductor substrate and forming peripheral circuitry;
   forming first plugs connected to the select transistor;
   forming first wires in the memory cell region and in the peripheral circuitry region;
   forming a first interlayer insulating film on the first wires;
   forming a second plug and a third plug in the first interlayer insulating film, the second and third plugs being connected to the first wires formed in the memory cell region and in the peripheral circuitry region, respectively;

forming a conductive adhesive layer on the second plug, forming a phase change material layer, another conductive adhesive layer, and an upper electrode laminated to one another so as to cover the conductive adhesive layer, and forming an insulative (or nonconductive) adhesive layer between the first interlayer insulating film and the phase change material layer;

forming a silicon nitride film so as to cover the multilayer film;

forming a second interlayer insulating film over the upper electrode;

forming a second wire on the second interlayer insulating film;

forming a fourth plug connected between the upper electrode and the second wire; and forming a fifth plug in the second interlayer insulating film, the fifth plug being connected to the third plug.

2) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the first interlayer insulating film, the multilayer film including a first adhesive layer, a phase change material layer, a second adhesive layer, and an upper electrode laminated to one another, the first adhesive layer being connected to the second plug;

forming a silicon nitride film so as to cover the multilayer film;

forming a second interlayer insulating film over the upper electrode;

forming a second wire on the second interlayer insulating film;

forming a fourth plug connected between the upper electrode and the second wire; and forming a fifth plug in the second interlayer insulating film, the fifth plug being connected to the third plug.

3) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the first interlayer insulating film, the multilayer film including a first adhesive layer, a phase change material layer, a second adhesive layer, and an upper electrode laminated to one another, the first adhesive layer being connected to the second plug;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

4) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the first interlayer insulating film, the multilayer film including a first adhesive layer, a phase change material layer, and an upper electrode laminated to one another, the first adhesive layer being connected to the second plug;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

5) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the first interlayer insulating film, the multilayer film including a phase change material layer and a second adhesive layer, and an upper electrode laminated to one another, the phase change material layer being connected to the second plug;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

6) The method described in item 1 or 2 above, wherein:

the silicon nitride film is formed to extend into the peripheral circuitry region;

the fifth-plug forming step includes a step of forming a via for the fifth plug in the second interlayer insulating film; and the silicon nitride film is used as an etching stopper at the via forming step.

7) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the first interlayer insulating film, the multilayer film including a conductive adhesive layer, a phase change material layer, and an upper electrode laminated to one another, the conductive adhesive layer being connected to the second plug;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

8) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a phase change material layer and an upper electrode laminated over the second plug, and forming an insulative adhesive layer between the first interlayer insulating film and the phase change material layer;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

9) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a conductive adhesive layer on the second plug, and forming a phase change material layer, another conductive adhesive layer, and an upper electrode laminated to one another so as to cover the conductive adhesive layer;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

10) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a conductive adhesive layer on the second plug, forming a phase change material, another conductive adhesive layer, and an upper electrode laminated to one another so as to cover the conductive adhesive layer, and forming an insulative adhesive layer between the first interlayer insulating film and the phase change material layer;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

11) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the second plug, the multilayer film including a phase change material layer, a conductive adhesive layer, and an upper electrode laminated to one another;

forming a second interlayer insulating film on the upper electrode;

forming a second wire on the second interlayer insulating film;

forming a fourth plug connected between the upper electrode and the second wire; and forming a fifth plug in the second interlayer insulating film, the fifth plug being connected to the third plug.

12) A method for manufacturing a semiconductor integrated circuit device, comprising the steps of:

forming a select transistor in a memory cell region on a semiconductor substrate and forming peripheral circuitry;

forming first plugs connected to the select transistor;

forming first wires in the memory cell region and in the peripheral circuitry region;

forming a first interlayer insulating film on the first wires;

forming a second plug and a third plug in the first interlayer insulating film, the second and third plugs being connected to the first wires formed in the memory cell region and in the peripheral circuitry region, respectively;

forming a multilayer film on the second plug, the multilayer film including a phase change material layer and an upper electrode laminated to each other;

forming a silicon nitride film so as to cover the multilayer film;

forming a second interlayer insulating film over the upper electrode;

forming a second wire on the second interlayer insulating film;

forming a fourth plug connected between the upper electrode and the second wire; and forming a fifth plug in the second interlayer insulating film, the fifth plug-being connected to the third plug.

INDUSTRIAL APPLICABILITY

The present invention can be applied to semiconductor integrated circuit devices that employ phase change memory cells formed of a phase change material such as chalcogenide.

DESCRIPTION OF REFERENCE NUMERALS

Figure 1:
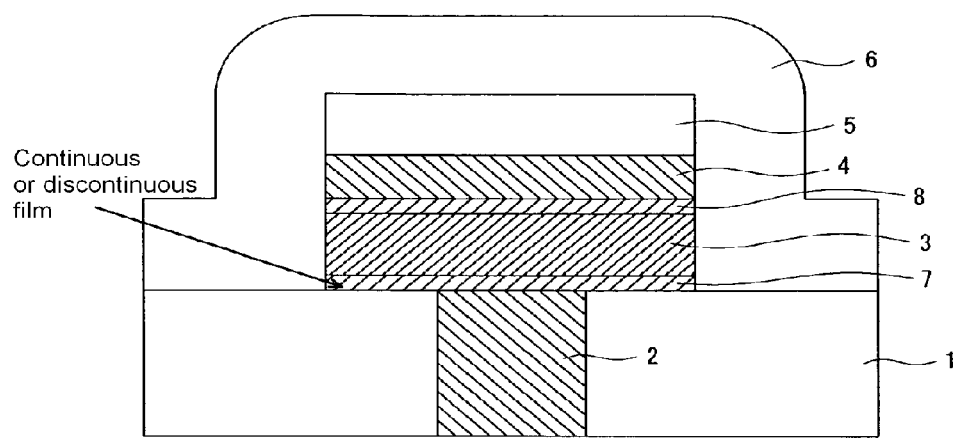
FIG. 1 is a cross-sectional view of a phase change memory cell according to the present invention.
Figure 2:
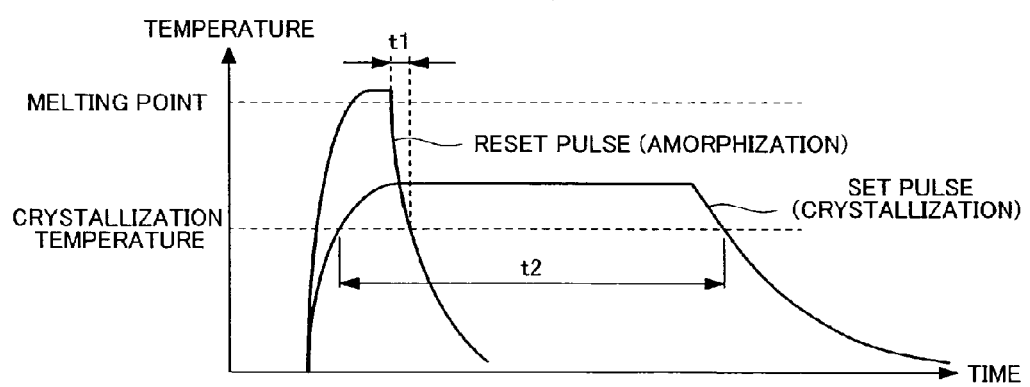
FIG. 2 is a diagram showing specifications of current pulses for changing the phase state of chalcogenide.
Figure 3:
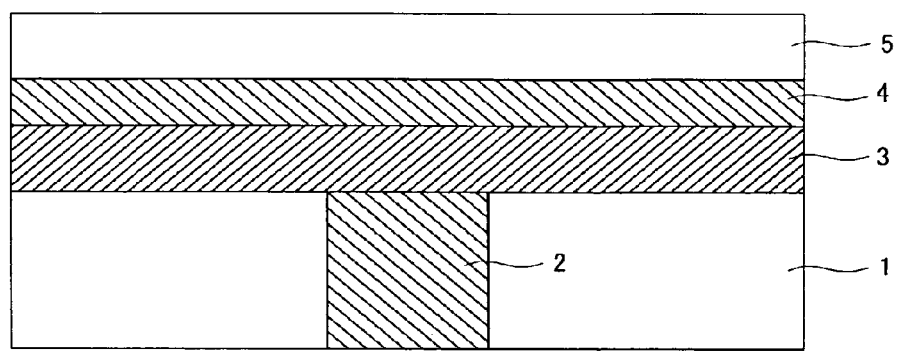
FIG. 3 is a cross-sectional view showing a step in a process of manufacturing a phase change memory cell using a conventional technique.
Figure 4:
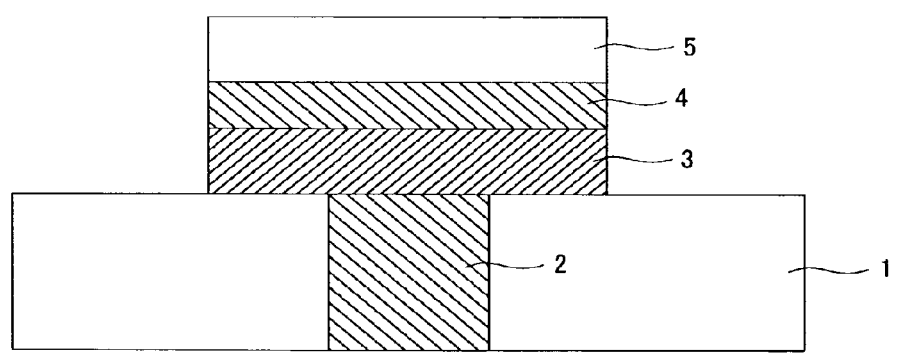
FIG. 4 is a cross-sectional view showing another step in the process of manufacturing a phase change memory cell using a conventional technique.
Figure 5:
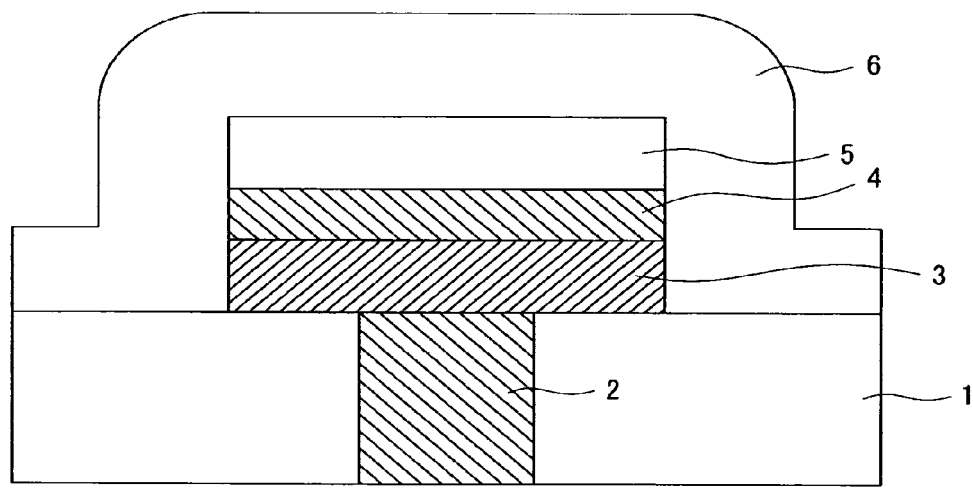
FIG. 5 is a cross-sectional view showing still another step in the process of manufacturing a phase change memory cell using a conventional technique.
Figure 6A:
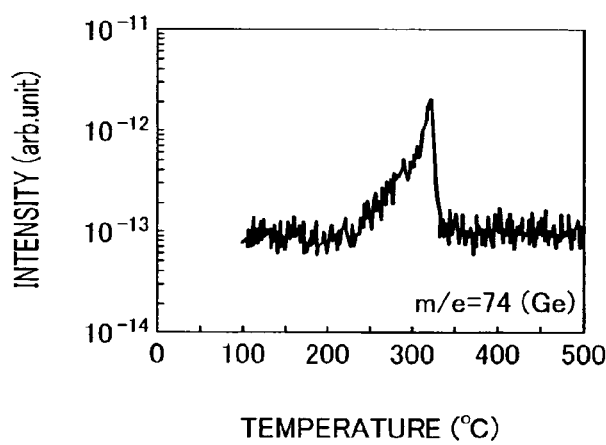
FIG. 6A is a diagram showing results of thermal desorption spectrometry of a GeSbTe film.
Figure 6B:
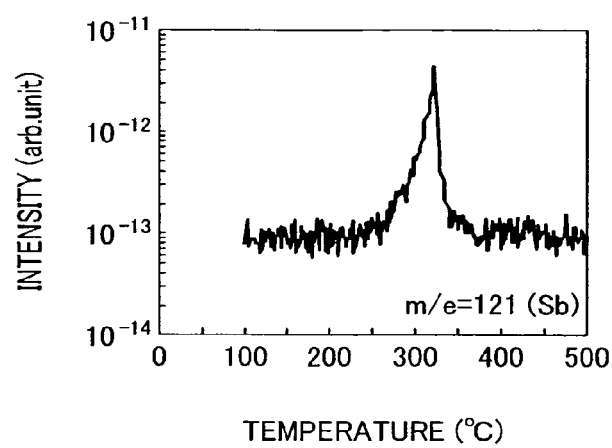
FIG. 6B is a diagram showing results of thermal desorption spectrometry of a GeSbTe film.
Figure 6C:
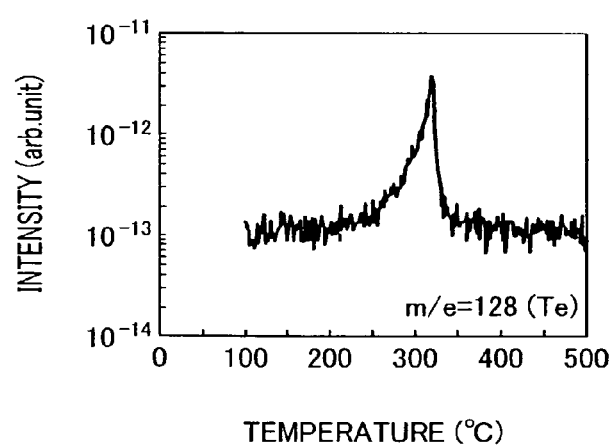
FIG. 6C is a diagram showing results of thermal desorption spectrometry of a GeSbTe film.
Figure 7:
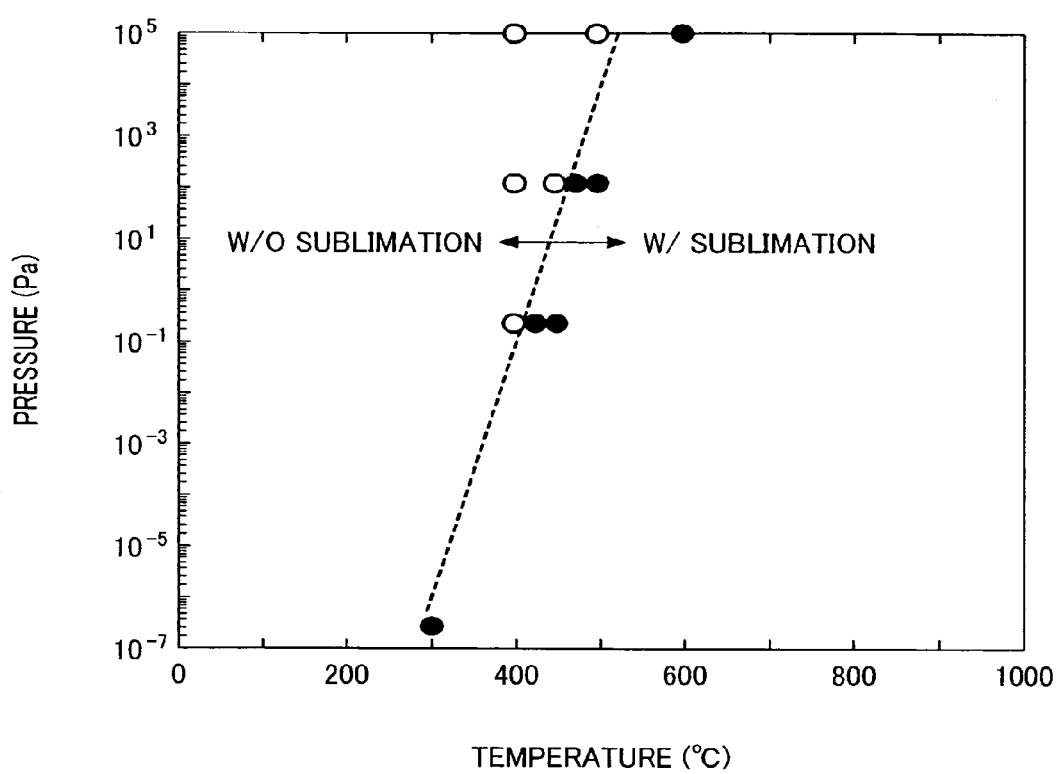
FIG. 7 is a graph showing the sublimation characteristics of a GeSbTe film, wherein the horizontal axis represents temperature and the vertical axis represents pressure.
Figure 8:
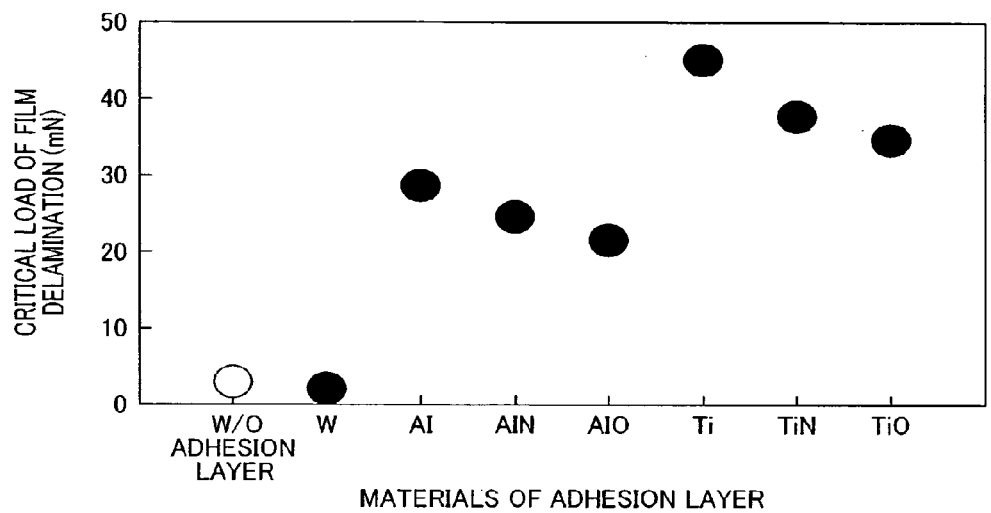
FIG. 8 is a diagram comparing critical delamination load measurement results obtained from scratch tests.
Figure 9A:
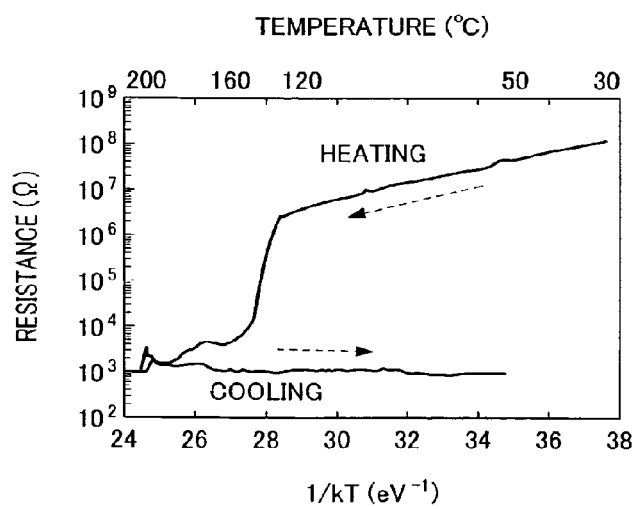
FIG. 9A is a diagram illustrating how an adhesive layer affects the temperature vs. resistance characteristics of a GeSbTe film.
Figure 9B:
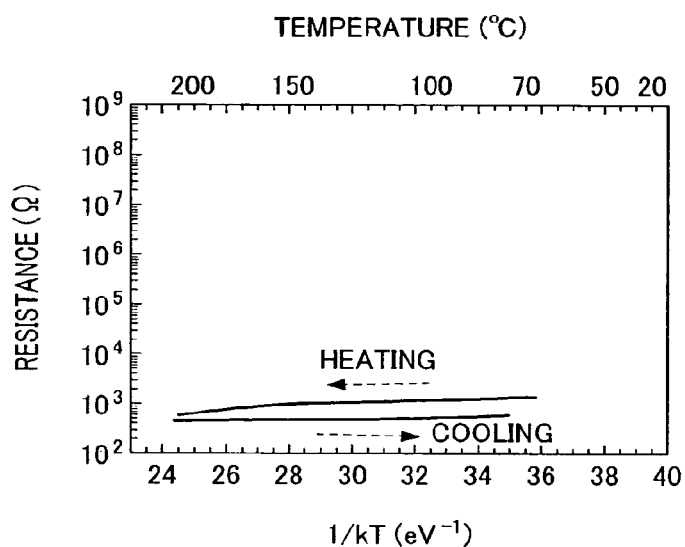
FIG. 9B is another diagram illustrating how an adhesive layer affects the temperature vs. resistance characteristics of a GeSbTe
Figure 10:
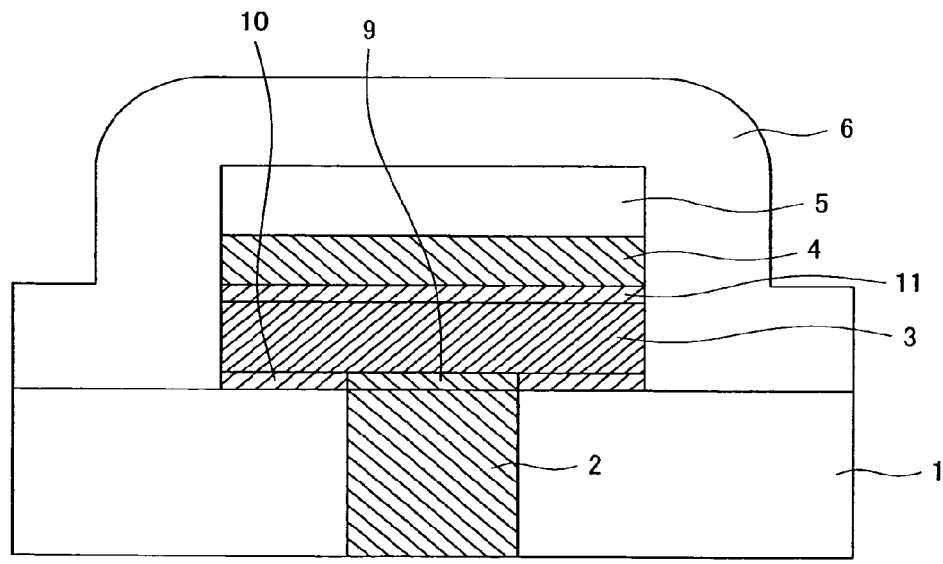
FIG. 10 is a cross-sectional view of a phase change memory cell of the present invention.
Figure 11:
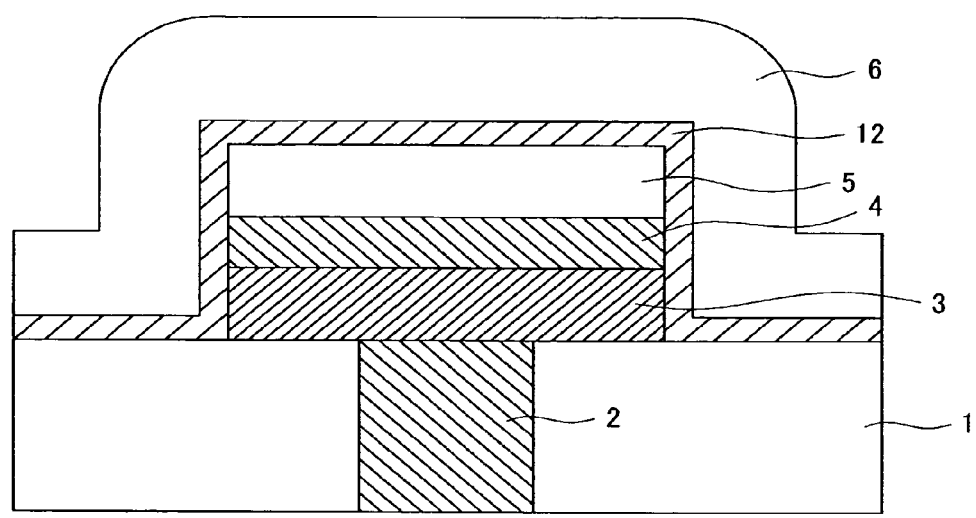
FIG. 11 is a cross-sectional view of another phase change memory cell of the present invention.
Figure 12:
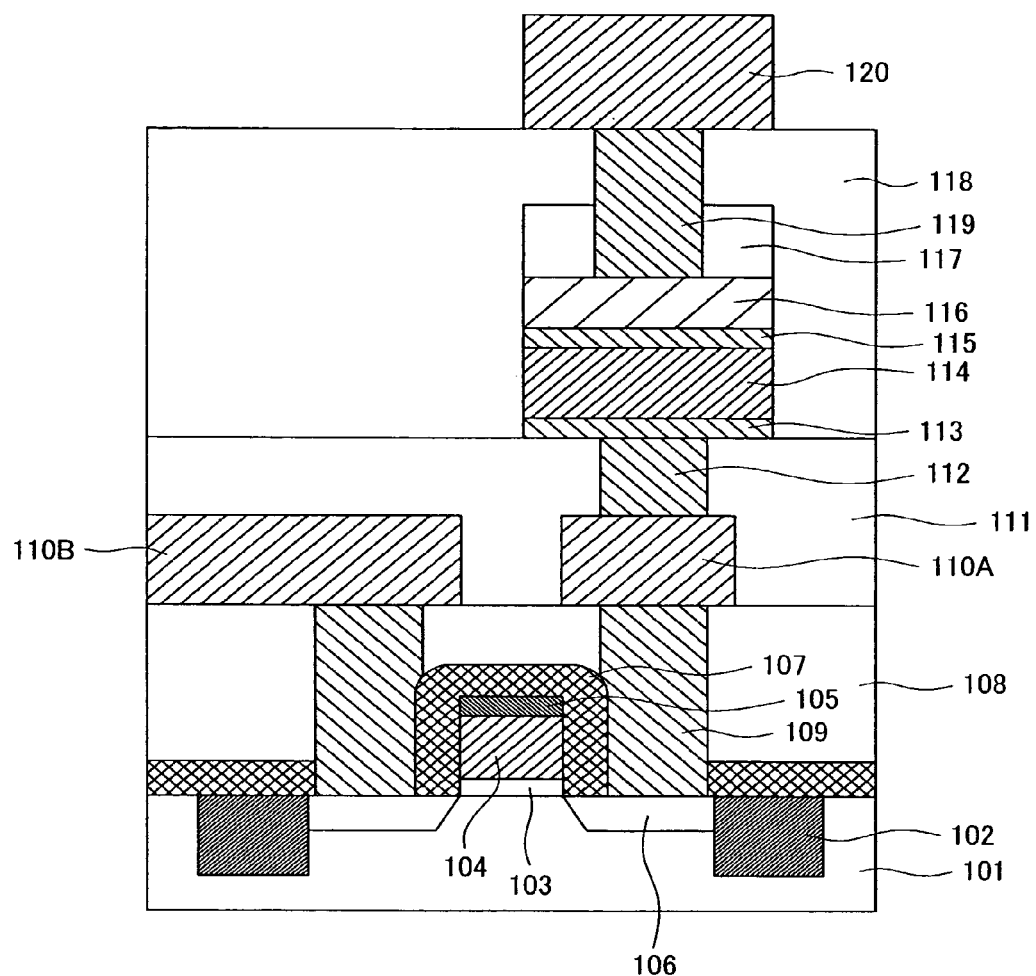
FIG. 12 is a cross-sectional view of a phase change memory cell according to a first embodiment of the present invention.
Figure 13:
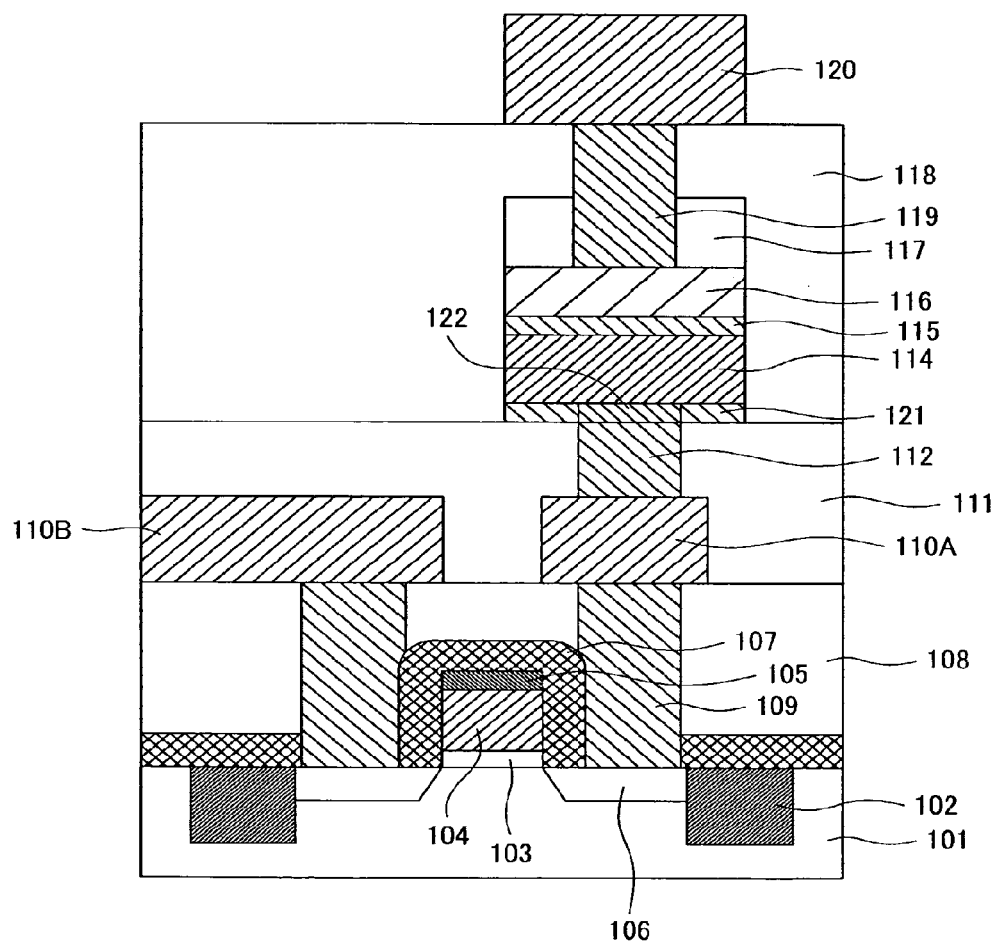
FIG. 13 is a cross-sectional view of a phase change memory cell according to a second embodiment of the present invention.
Figure 14:
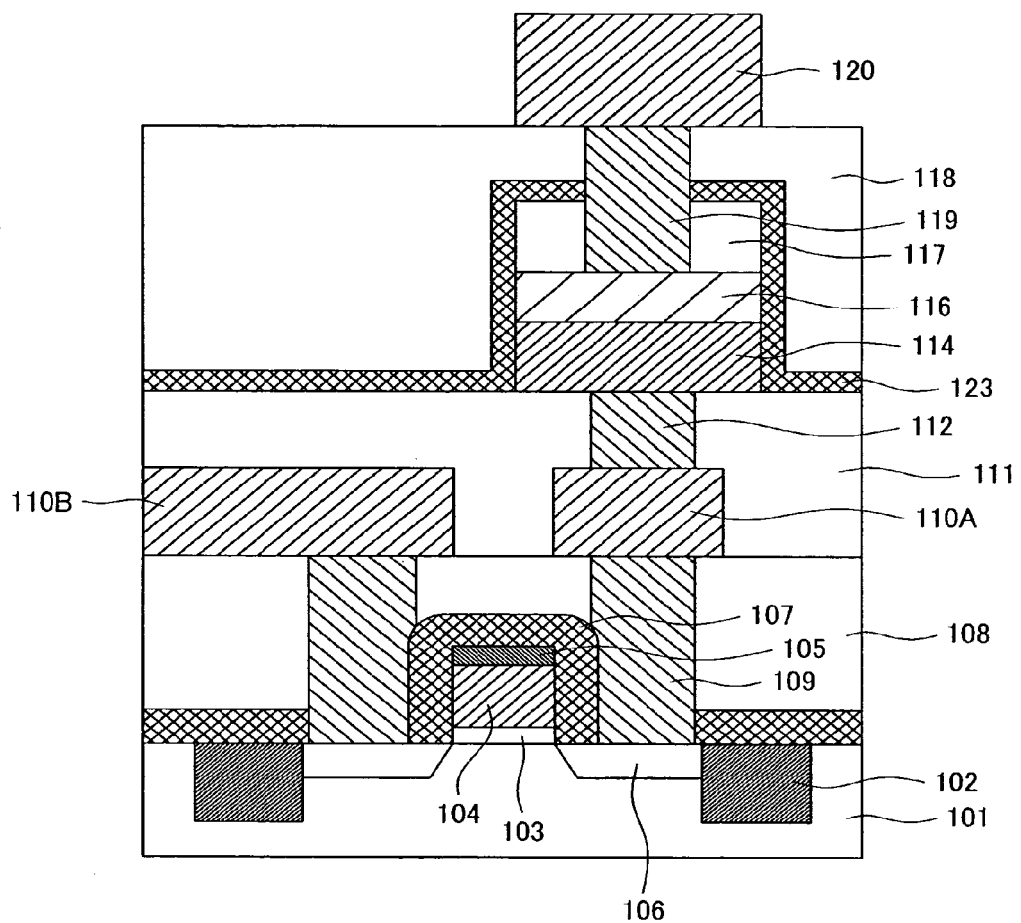
FIG. 14 is a cross-sectional view of a phase change memory cell according to a third embodiment of the present invention.
Figure 15:
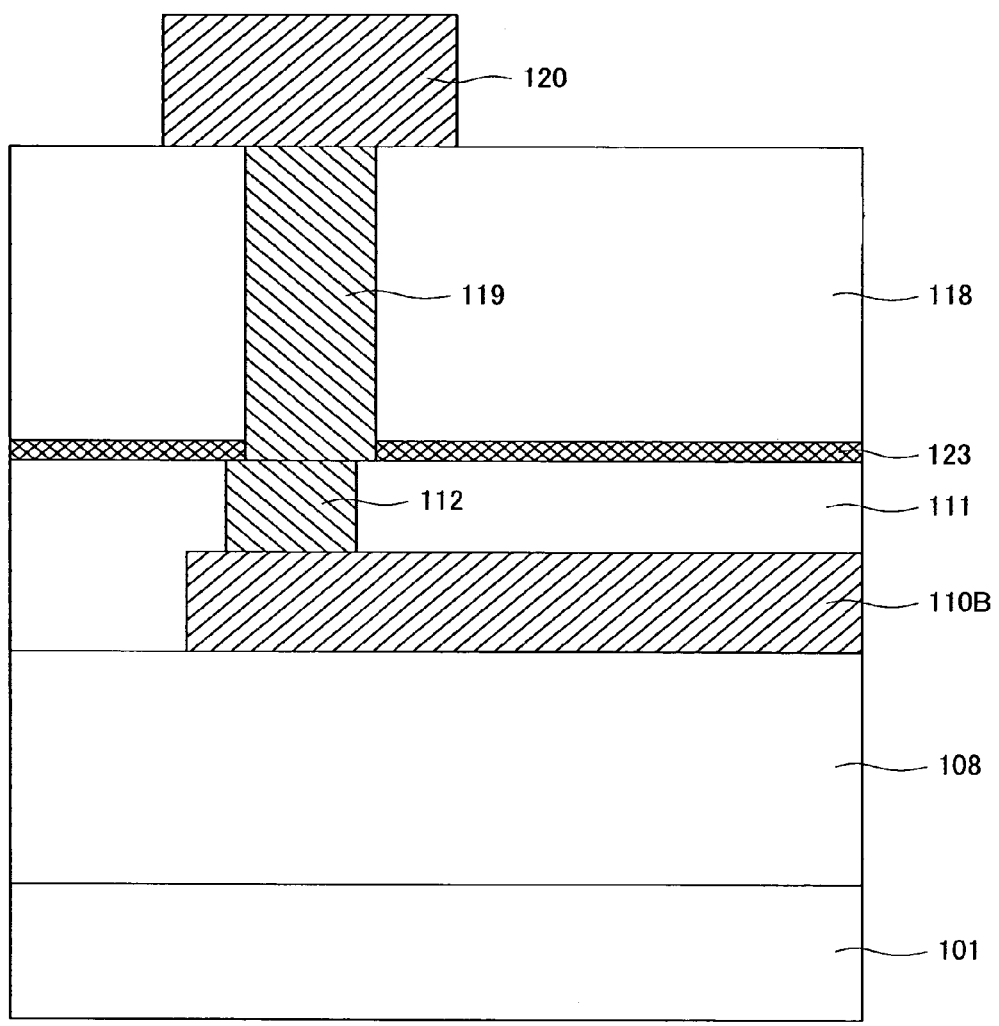
FIG. 15 is another cross-sectional view of the phase change memory cell according to the third embodiment.

1 . . . interlayer insulating film
2 . . . plug
3 . . . chalcogenide material layer
4 . . . upper electrode
5 . . . hard mask
6 . . . interlayer insulating film
7 . . . adhesive layer
8 . . . adhesive layer
9 . . . conductive adhesive layer
10 . . . insulative adhesive layer
11 . . . conductive adhesive layer
12 . . . sidewall protective film
101 . . . semiconductor substrate
102 . . . trench isolation oxide film
103 . . . gate oxide film
104 . . . gate electrode
105 . . . silicon nitride film
106 . . . diffusion layer
107 . . . silicon nitride film
108 interlayer insulating film
109 . . . tungsten plug
110A, 110B . . . first wiring layer
111 . . . interlayer insulating film
112 tungsten plug
113 conductive adhesive layer
114 chalcogenide material layer
115 . . . conductive adhesive layer
116 . . . upper electrode
117 . . . silicon oxide film
118 . . . interlayer insulating film
119 . . . tungsten plug
120 second wiring layer
121 . . . insulative adhesive layer
122 . . . conductive adhesive layer
123 . . . sidewall protective film (silicon nitride film)

The invention claimed is:

1. A method of manufacturing a semiconductor integrated circuit device, comprising steps of:
 (a) forming a MISFET over a semiconductor substrate;
 (b) forming a first interlayer insulating film over the semiconductor substrate in order to cover the MISFET;
 (c) forming a first plug and a second plug in the first interlayer insulating film;
 (d) forming a chalcogenide material film over the first interlayer insulating film and over the first plug such that a bottom surface of the chalcogenide material film is located over the first plug;
 (e) forming an electrode over the chalcogenide material film;
 (f) forming a protective film over the electrode, over the first interlayer insulating film and over the second plug in order to cover a side surface of the chalcogenide material film;
 (g) forming a second interlayer insulating film over the protective film;
 (h) forming a first contact hole and a second contact hole in the second interlayer insulating film and in the protective film, such that the first contact hole reaches the electrode and the second contact hole reaches the second plug; and
 (i) forming a third plug in the first contact hole, and forming a fourth plug in the second contact hole, wherein, in the step (h), the protective film is used for an etching stopper when the second interlayer insulating film is etched.

2. A method of manufacturing a semiconductor integrated circuit device according to claim 1,
wherein the protective film includes a silicon nitride film.

3. A method of manufacturing a semiconductor integrated circuit device according to claim 2, wherein the second interlayer insulating film includes a silicon oxide film.

4. A method of manufacturing a semiconductor integrated circuit device according to claim 2,
wherein the protective film is formed by a plasma CVD method.

5. A method of manufacturing a semiconductor integrated circuit device according to claim 4,
wherein the protective film is formed under a condition in which a pressure is 0.1 Pa or more and a temperature is 450° C. or less.

6. A method of manufacturing a semiconductor integrated circuit device according to claim 1,
wherein the chalcogenide material film includes Ge, Sb and Te.

7. A method of manufacturing a semiconductor integrated circuit device according to claim 1, further comprising a step of annealing after the step (e), whereby the chalcogenide material film is crystallized.

8. A method of manufacturing a semiconductor integrated circuit device according to claim 7,
wherein the step of annealing is performed under a condition including an argon gas and a nitrogen gas.

9. A method of manufacturing a semiconductor integrated circuit device according to claim 1,
wherein the electrode includes a tungsten film.

10. A method of manufacturing a semiconductor integrated circuit device according to claim 1,
wherein the first plug is electrically connected to one of a source region of the MISFET or a drain region of the MISFET, and
wherein the second plug is electrically connected to the other of the source region or the drain region.

11. A method of manufacturing a semiconductor integrated circuit device, comprising steps of:
(a) forming a MISFET over a semiconductor substrate;
(b) forming a first interlayer insulating film over the semiconductor substrate in order to cover the MISFET;
(c) forming a first plug and a second plug in the first interlayer insulating film;
(d) forming a chalcogenide material film over the first interlayer insulating film and over the first plug such that a bottom surface of the chalcogenide material film is located over the first plug;
(e) forming an electrode over the chalcogenide material film;
(f) forming a protective film over the electrode, over the first interlayer insulating film and over the second plug in order to cover a side surface of the chalcogenide material film;
(g) forming a second interlayer insulating film over the protective film;
(h) forming a first contact hole and a second contact hole in the second interlayer insulating film and in the protective film, such that the first contact hole reaches the electrode and the second contact hole reaches the second plug; and
(i) forming a third plug in the first contact hole, and forming a fourth plug in the second contact hole, wherein the step (h) includes steps of:
(h1) etching the second interlayer insulating film under a condition in which an etching rate of the second interlayer insulating film is higher than an etching rate of the protective film, and
(h2) etching the protective film under a condition in which an etching rate of the protective film is higher than an etching rate of the second interlayer insulating film.

12. A method of manufacturing a semiconductor integrated circuit device according to claim 11,
wherein the protective film includes a silicon nitride film.

13. A method of manufacturing a semiconductor integrated circuit device according to claim 12,
wherein the second interlayer insulating film includes a silicon oxide film.

14. A method of manufacturing a semiconductor integrated circuit device according to claim 12,
wherein the protective film is formed by a plasma CVD method.

15. A method of manufacturing a semiconductor integrated circuit device according to claim 14,
wherein the protective film is formed under a condition in which a pressure is 0.1 Pa or more and a temperature is 450° C. or less.

16. A method of manufacturing a semiconductor integrated circuit device according to claim 11,
wherein the chalcogenide material film includes Ge, Sb and Te.

17. A method of manufacturing a semiconductor integrated circuit device according to claim 11, further comprising a step of annealing after the step (e), whereby the chalcogenide material film is crystallized.

18. A method of manufacturing a semiconductor integrated circuit device according to claim 17, wherein the step of annealing is performed under a condition including an argon gas and a nitrogen gas.

19. A method of manufacturing a semiconductor integrated circuit device according to claim 11,
wherein the electrode includes a tungsten film.

20. A method of manufacturing a semiconductor integrated circuit device according to claim 11,
wherein the first plug is electrically connected to one of a source region of the MISFET or a drain region of the MISFET, and
wherein the second plug is electrically connected to the other of the source region or the drain region.

* * * * *